(12) United States Patent
Chen et al.

(10) Patent No.: US 9,037,938 B2
(45) Date of Patent: May 19, 2015

(54) HARDWARE ARCHITECTURE AND IMPLEMENTATION OF LOW POWER LAYERED MULTI-LEVEL LDPC DECODER

(71) Applicant: LSI Corporation, Milpitas, CA (US)

(72) Inventors: Lei Chen, Sunnyvale, CA (US);
Johnson Yen, Fremont, CA (US);
Zongwang Li, Dublin, CA (US);
Chung-Li Wang, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 241 days.

(21) Appl. No.: 13/664,071

(22) Filed: Oct. 30, 2012

(65) Prior Publication Data

US 2014/0122979 A1    May 1, 2014

(51) Int. Cl.
*H03M 13/00*    (2006.01)
*H03M 13/11*    (2006.01)

(52) U.S. Cl.
CPC ...... *H03M 13/1122* (2013.01); *H03M 13/1137* (2013.01); *H03M 13/114* (2013.01); *H03M 13/116* (2013.01); *H03M 13/1171* (2013.01); *H03M 13/658* (2013.01); *H03M 13/6591* (2013.01)

(58) Field of Classification Search
CPC . H03M 13/11; H03M 13/27; H03M 13/1102; H03M 13/1154; H03M 13/1157; H03M 13/116; H01L 1/10057; H01L 1/10041; G11B 20/18
USPC .......................................... 714/752, 779, 755
See application file for complete search history.

(56) References Cited

U.S. PATENT DOCUMENTS

| | | | |
|---|---|---|---|
| 7,617,432 B2 | 11/2009 | Novichkov et al. | |
| 7,770,090 B1* | 8/2010 | Kons et al. ..................... | 714/780 |
| 8,209,590 B2 | 6/2012 | Shen et al. | |
| 2005/0149843 A1* | 7/2005 | Shen et al. .................... | 714/800 |
| 2007/0089016 A1* | 4/2007 | Bhatt et al. ................... | 714/752 |
| 2007/0089018 A1* | 4/2007 | Tang et al. .................... | 714/752 |
| 2008/0082868 A1* | 4/2008 | Tran et al. ..................... | 714/699 |
| 2010/0034323 A1* | 2/2010 | Stoye ............................. | 375/341 |
| 2010/0042898 A1* | 2/2010 | Gunnam ........................ | 714/755 |
| 2010/0131819 A1* | 5/2010 | Graef ............................. | 714/752 |

* cited by examiner

*Primary Examiner* — Albert Decady
*Assistant Examiner* — Osman Alshack
(74) *Attorney, Agent, or Firm* — Suiter Swantz pc llo

(57) ABSTRACT

A layered LDPC decoder sorts and selects a subset of message entries for processing based on entry size. MIN1 and MIN2 values for each message entry in the subset are truncated, and either the truncated values or non-truncated values are combined with a symbol vector based on whether the subset of message entries includes a variable node associated with the layer being processed.

19 Claims, 4 Drawing Sheets

$$P_{i,j} = \begin{bmatrix} 0 & \alpha & 0 & \cdots & 0 \\ 0 & 0 & \alpha & \cdots & 0 \\ \cdots & \cdots & \cdots & \ddots & \cdots \\ 0 & 0 & 0 & \cdots & \alpha \\ \alpha & 0 & 0 & \cdots & 0 \end{bmatrix}$$

HARDWARE ARCHITECTURE AND IMPLEMENTATION OF LOW POWER LAYERED MULTI-LEVEL LDPC DECODER

BACKGROUND OF THE INVENTION

In most real signal transmission applications there can be several sources of noise and distortions between the source of the signal and its receiver. As a result, there is a strong need to correct mistakes in the received signal. As a solution for this task one should use some coding technique with adding some additional information (i.e., additional bits to the source signal) to ensure correcting errors in the output distorted signal and decoding it. One type of coding technique utilizes low-density parity-check (LDPC) codes. LDPC codes are used because of their fast decoding (linearly depending on codeword length) property.

Iterative decoding algorithms allows a high degree of parallelism in processing, favoring the design of high throughput architectures of the related decoder. However, routing congestion and memory collision might limit a practical exploitation of the inherent parallelism a decoding algorithm. In order to solve this problem, codes are designed with a block structure (having blocks of size P) that naturally fit with the vectorization of the decoder architecture, thus guaranteeing a collision-free parallelism of P.

Multi-level LDPC codes have much better performance than binary LDPC code. However, they also have much more hardware complexity than binary LDPC decoders, which leads to prohibitively large size and power consumption in hardware.

Consequently, it would be advantageous if an apparatus existed that is suitable for a layered multi-level LDPC decoder with very small size and power consumption.

SUMMARY OF THE INVENTION

Accordingly, the present invention is directed to a novel method and apparatus for a layered multi-level LDPC decoder with very small size and power consumption It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

For large finite fields, for example GF(256), a message may have 256 entries, each entry having a soft value. Large messages may necessitate complicated architecture to decode.

Figure 1:
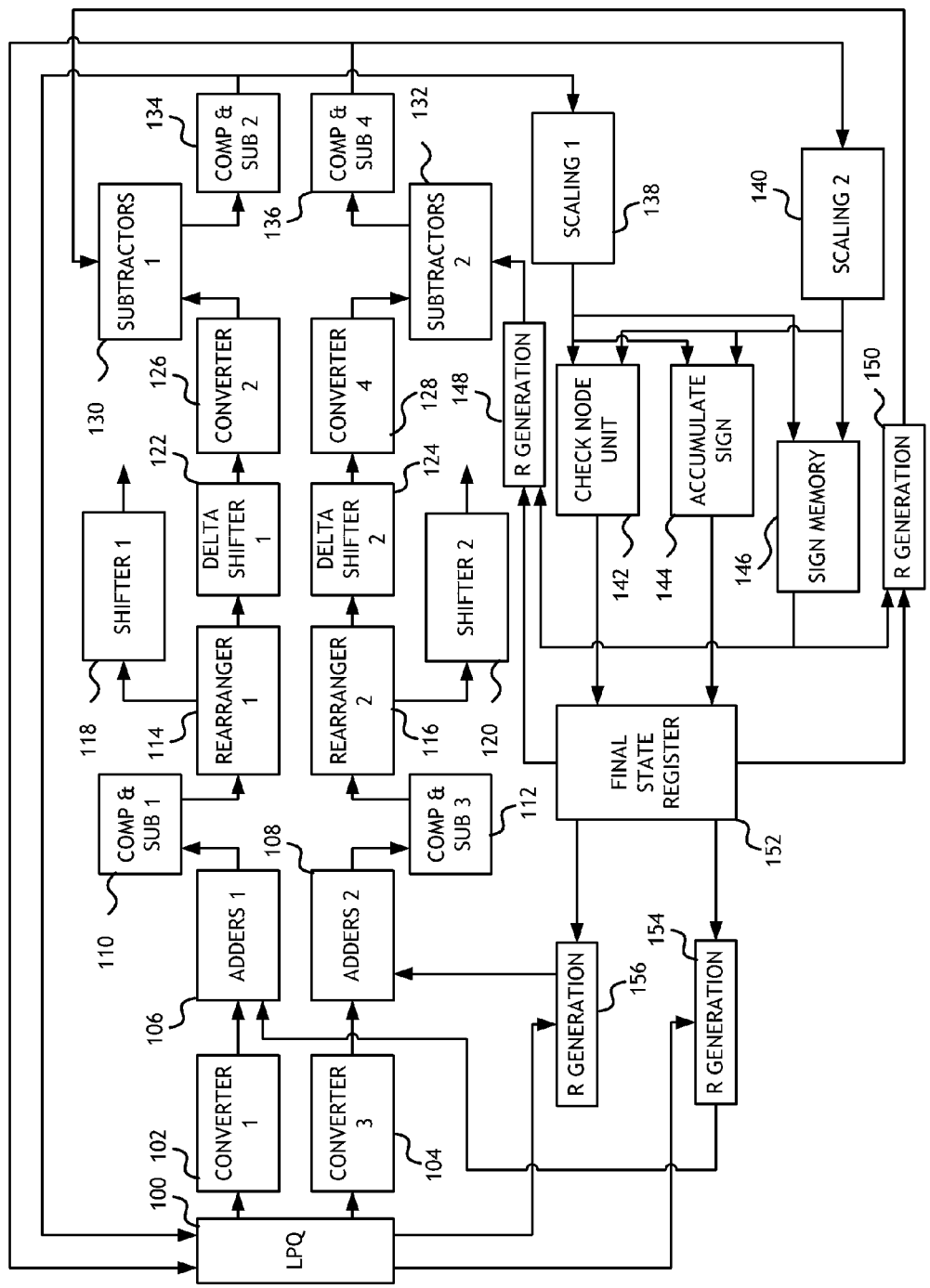
FIG. 1 shows a block diagram for a multi-layered LDPC decoder.

Referring to FIG. 1, a block diagram for a multi-layered LDPC decoder is shown. The LDPC decoder may include a LPQ unit 100. The LPQ unit 100 may be a decoder memory which stores soft log-likelihood ratio (LLR) input values, Q values and soft LLR output P values. The LPQ unit 100 may be a ping-pong memory and consists of a plurality of banks; for example, the LPQ unit 100 may comprise sixteen banks, with each bank with size 54×264. The LPQ unit 100 may pass Q values to a converter of the connected layer of a variable node. The Q value of each symbol consists of one hard decision and three soft LLR values.

The LPQ unit 100 may be connected to one or more converters 102, 104. A first converter 102 and a second converter 104 may convert the format of one hard decision and three LLR values into four LLR values.

Each of the first converter 102 and the second converter 104 may be connected to an adder 106, 108. Each of the first adder 106 and second adder 108 may consist of four adder elements. Each of the first adder 106 and second adder 108 may add the connected layer's Q value (output of LPQ unit 100) with the connected layer's R value (output of a C2Vupdate or R generator 154, 156) of each symbol of a circulant respectively and obtain soft LLR values for each symbol.

Each of the first adder 106 and second adder 108 may be connected to a comparator and subtractor unit 110, 112. Comparator and subtractor units 110, 112 may compare the outputs of the associated adder 106, 108 to find the minimum value and hard decision. The comparator and subtractor units 110, 112 may also subtract a minimum value from four soft LLR values.

Each comparator and subtractor unit 110, 112 may be connected to a rearranger unit 114, 116. Each rearranger unit 114, 116 may rearrange variable node updated values to prepare for the check node update. The output from each rearranger 114, 116 may be sent to a delta shifter 122, 124. Each delta shifter 122, 124 may shift the output from the associated rearranger 114, 116 by a difference defined by the current layer and a connected layer. The output from each rearranger 114, 116 may also be sent to a shifter 118, 120. Each shifter 118, 120 may shift back the soft LLR value to a column order to produce a soft LLR output.

Each delta shifter 122, 124 may be connected to a converter 126, 128. The third converter 126 and fourth converter 128 may each convert the format of one hard decision and three LLR values into four LLR values.

Each of the third converter 126 and fourth converter 128 may be connected to a subtractor unit 130, 132. Each of the subtractor units 130, 132 may receive LLR values from an associated converter 126, 128 and an R value from an R generation units 148, 150. Each of the subtractor units 130, 132 may then subtract an associated R value from a soft LLR P value to obtain a Q value for symbols in the current layer.

Each subtractor unit 130, 132 may be connected to a comparator and subtractor unit 134, 136. Comparator and subtractor units 134, 136 may compare the four values of the outputs of the subtractor units 130, 132 and find the minimum value and hard decision. The comparator and subtractor units 134, 136 may also subtract a minimum value from four soft LLR values. The output from the comparator and subtractor units 134, 136 may be sent to the LPQ unit 100 to update one or more Q values for the current layer, and the output may be sent to respective scaling units 138, 140 in order to perform a check node to variable node update.

Each of the scaling units 138, 140 may scale the output of associated comparator and subtractor unit 134, 136 to produce new Q values. The new Q values may be sent to a check node unit 142, an accumulate sign unit 144 and a sign memory 146. The check node unit 142 may find first minimum value ($MIN_1$), second minimum value ($MIN_2$) and an index of the minimum value ($MIN_{idx}$). The accumulate unit 144 may receive the sign of the Q value and calculate an accumulative sign for the current layer. The sign memory 146 may receive the sign of the Q value and store the sign value for each non-zero element in the parity check matrix of the LDPC code.

Output from the check node unit 142 and accumulate sign unit 144 may be sent to a final state register 152. The final state register 152 may register the final state of the current decoding iteration which may consist of the $MIN_1$ value, the $MIN_2$ value, the $MIN_{idx}$, and the accumulative sign of the current layer.

The final state register 152 may be connected to a plurality of R generation units 148, 150, 154, 156. Each R generation unit 148, 150, 154, 156 may receive the $MIN_1$ value, the $MIN_2$ value, the $MIN_{idx}$, and the accumulative sign from the final state register 152. A first R generation unit 148 and second R generation unit 150 may receive a current sign value from the sign memory 146. Each of the first R generation unit 148 and second R generation unit 150 may produce an R value for the connected or current layer based on the final state and current column index of the symbol being processed. For example, if the current column index is equal to $MIN_{idx}$, the R value may be $MIN_2$; otherwise the R value may be $MIN_1$. The sign of the R value may be an exclusive disjunction (XOR) of the accumulative sign and the current sign of the symbol. Each of the first R generation unit 148 and the second R generation unit 150 may send an R value to a respective subtractor unit 130, 132.

A third R generation unit 154 and fourth R generation unit 156 may receive a current Q value from the LPQ unit 100. Each of the third R generation unit 154 and fourth R generation unit 156 may produce an R value for the connected or current layer based on the final state and current column index of the symbol being processed. For example, if the current column index is equal to $MIN_{idx}$, the R value may be $MIN_2$; otherwise the R value may be $MIN_1$. The sign of the R value may be an exclusive disjunction (XOR) of the accumulative sign and the current sign of the symbol. Each of the third R generation unit 154 and the fourth R generation unit 154 may send an R value to a respective adder 106, 108.

Such a device may decode two circulants of a LDPC encoded message in multiple layers through a series of iterations. One skilled in the art may appreciate that elements of the device may operate in parallel while other elements may resolve the parallel processes into a final state.

Figure 2:
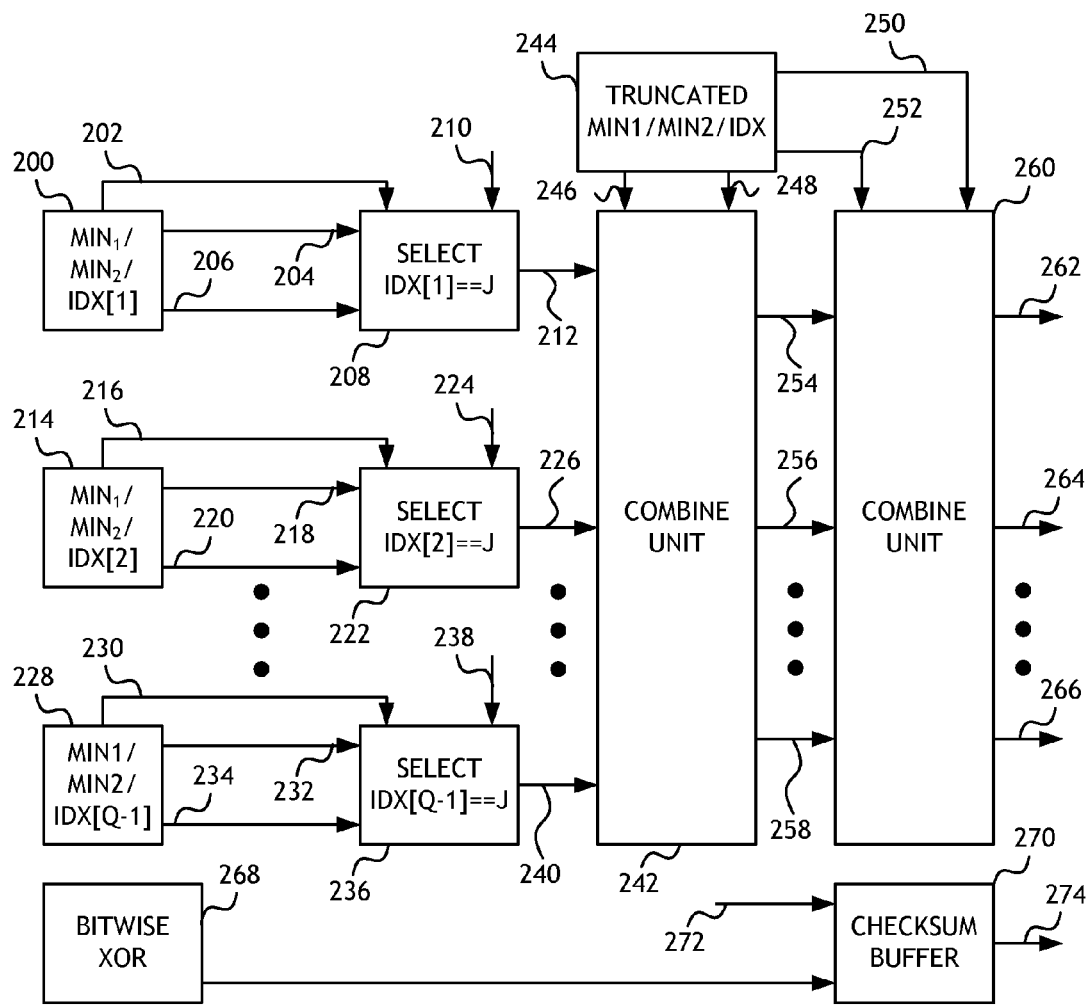
FIG. 2 shows a block diagram for a check node processor.

Referring to FIG. 2, a block diagram for a check node processor is shown. When decoding a LDPC encoded message, a check node processor may receive a message comprising a plurality of entries. Each message entry 200, 214, 228 may include a $MIN_1$ value 202, 216, 230, a $MIN_2$ value 204, 218, 232 and a $MIN_{idx}$ value 206, 220, 234. Each message entry 200, 214, 228 may be associated with a selection unit 208, 222, 236; and each selection unit 208, 222, 236 may receive a $MIN_1$ value 202, 216, 230, a $MIN_2$ value 204, 218, 232 and a $MIN_{idx}$ value 206, 220, 234 associated with a particular message entry 200, 214, 228. Each selection unit 208, 222, 236 may also receive a layer value 210, 224, 238 representing the layer of the message being processed. The layer being processed may be associated with a variable node in the LDPC code. Each selection unit 208, 222, 236 may select a value from one of the associated $MIN_1$ value 202, 216, 230, $MIN_2$ value 204, 218, 232 and $MIN_{idx}$ value 206, 220, 234 based on the associated layer value 210, 224, 238 to produce a symbol vector 212, 226, 240. Each symbol vector 212, 226, 240 may be received by a first combine unit 242.

For LDPC decoders processing large messages, for example messages having two hundred fifty-six entries, the decoder may include two hundred fifty-six selection units 208, 214, 228 and a first combine unit 242 capable of receiving two hundred fifty-six symbol vectors 212, 226, 240. The first combine unit may include a sorter to select a predetermined number of entries from the plurality of symbol vectors 212, 226, 240 and store, in a data structure, corresponding symbol indices and values for each selected entry. The sorter may determine the predetermined number of entries to store based on size with the smallest entries being selected. The value stored with each symbol index may be a corresponding check-to-variable (C2V) message or variable-to-check (V2C) message.

V2C messages may be truncated by a truncating unit 244. The truncating unit 244 may receive V2C messages comprising $MIN_1$ values, $MIN_2$ values and a $MIN_{idx}$ values. The truncating unit 244 may truncate each $MIN_1$ value for $\log_2(q)$ smallest entries and produce vectors for each of the predetermined number of entries. Each vector may include a $MIN_{vn}$ value corresponding to an index location for a particular variable node, a $MIN_{val}$ value corresponding to the value stored with the symbol index for a particular entry (soft value) and $MIN_{sym}$ value corresponding to a symbol index. The first combine unit 242 may then receive a $MIN_{val}$ value 246 and $MIN_{idx}$ value 248 corresponding to each of the truncated $MIN_1$ vectors. Where the current layer is not included in any $MIN_{vn}$ value for any of the predetermined number of entries, the encoded message may be processed by the first combine unit 242 using the truncated $MIN_1$ value; otherwise the non-truncated value may be used.

Where the first combine unit 242 processes the message using the non-truncated $MIN_1$ value, the sorter may resort entries to determine different entries for the predetermined number of entities and produce a plurality of vectors having $MIN_1$, $MIN_2$ and $MIN_{idx}$ values as set forth herein. When determining C2V messages for a particular variable node, the truncating unit 244 may select $MIN_1$ values and $MIN_2$ values to produce a vector for each entry and truncate each resulting vector. Each resulting vector may then be sent to the first combine unit 242.

Before the first combine unit 242 or a second combine unit 260 operates on any vectors, such as a plurality of symbol vectors 212, 226, 240, vectors may be prepared for each $MIN_{vn}$ in an index defined my $\log_2(q)-1$ to produce $\log_2(q)$ MIN' vectors for each $MIN_{vn}$ vector. The first combine unit 242 may then combine truncated vectors with original vectors and transfer such vector to the second combine unit 260.

The second combine unit 260 may receive $MIN_{idx}$ values 252 and $MIN_{val}$ values 250 from the truncating unit 244. The second combine unit 260 may select vectors to combine for each entry. If the particular layer being processed is a variable node in any index of the message being processed, the second combine unit 260 may use the MIN' vector corresponding to that index; otherwise symbol indexes and values as set forth herein may be used. The second combine unit 260 may then output C2V messages 262, 264, 266 corresponding to each entry.

During processing, the system may contemporaneously perform check operations. An XOR unit 268 may perform bitwise exclusive disjunction operations on check nodes and variable nodes to determine if a message conforms to the corresponding parity check matrix. The XOR unit 268 may send such parity check information to a checksum buffer 270 to correlate the parity check information with one or more V2C hard decision messages. The checksum buffer 270 may then produce a C2V hard decision message 274.

Figures 3, 4:
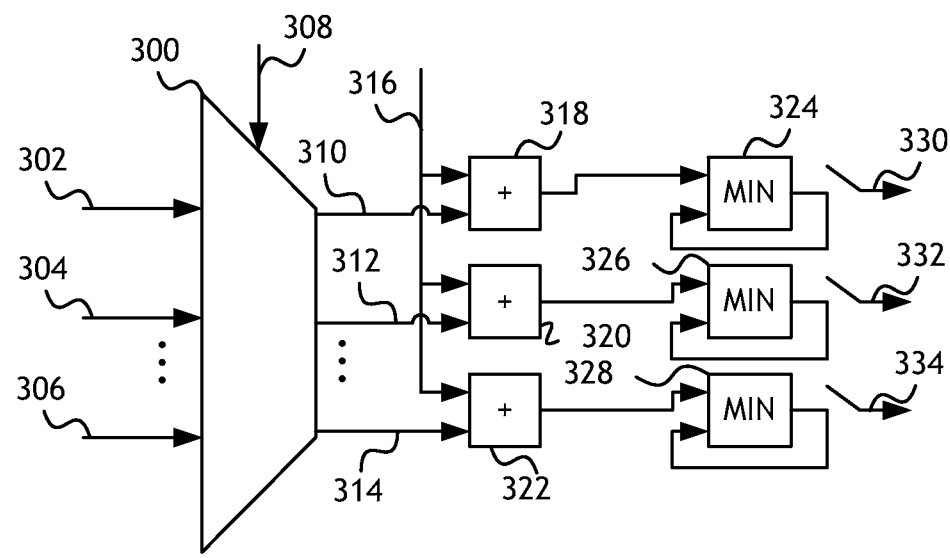
FIG. 3 shows a block diagram for a combine unit.
FIG. 4 shows a circulant matrix representing an element in a parity check matrix.

Referring to FIG. 3, a block diagram for a combine unit is shown. A combine unit, such as the first combine unit shown in FIG. 2, may include a reorder network 300. The reorder network 300 may receive a plurality of symbol vectors 302, 304, 306 corresponding to entries in a message. The reorder network 300 may also receive a symbol index 308. The reorder network 300 may store and reorder the symbol vectors such that each newly order symbol vector 310, 312, 314 has an index equal to the prior index plus the symbol index 308. each newly order symbol vector 310, 312, 314 may then be added to a symbol index vector 316 (the symbol vector having an index equal to the symbol index) by one or more additive units 318, 320, 322. The output from each additive unit 318, 320, 322 may maintained in a latch unit 324, 326, 328 until a subsequent cycle when the added updated vectors 330, 332, 334 may be output to a second combine unit.

Referring to FIG. 4, a circulant matrix representing an element in a parity check matrix; is shown. A parity check matrix useful in the present invention may comprise a finite GF(4) field. The parity check matrix may comprise twelve circulant rows and one hundred eight circulant columns; each circulant in the parity check matrix may comprise a sub-matrix.

Each sub-matrix may comprise a forty-eight by forty-eight matrix. A circulant sub-matrix according to the present invention may include columns having zero elements 400 and non-zero elements 402 that may be defined as an element over a Galois Field.

Figure 5:
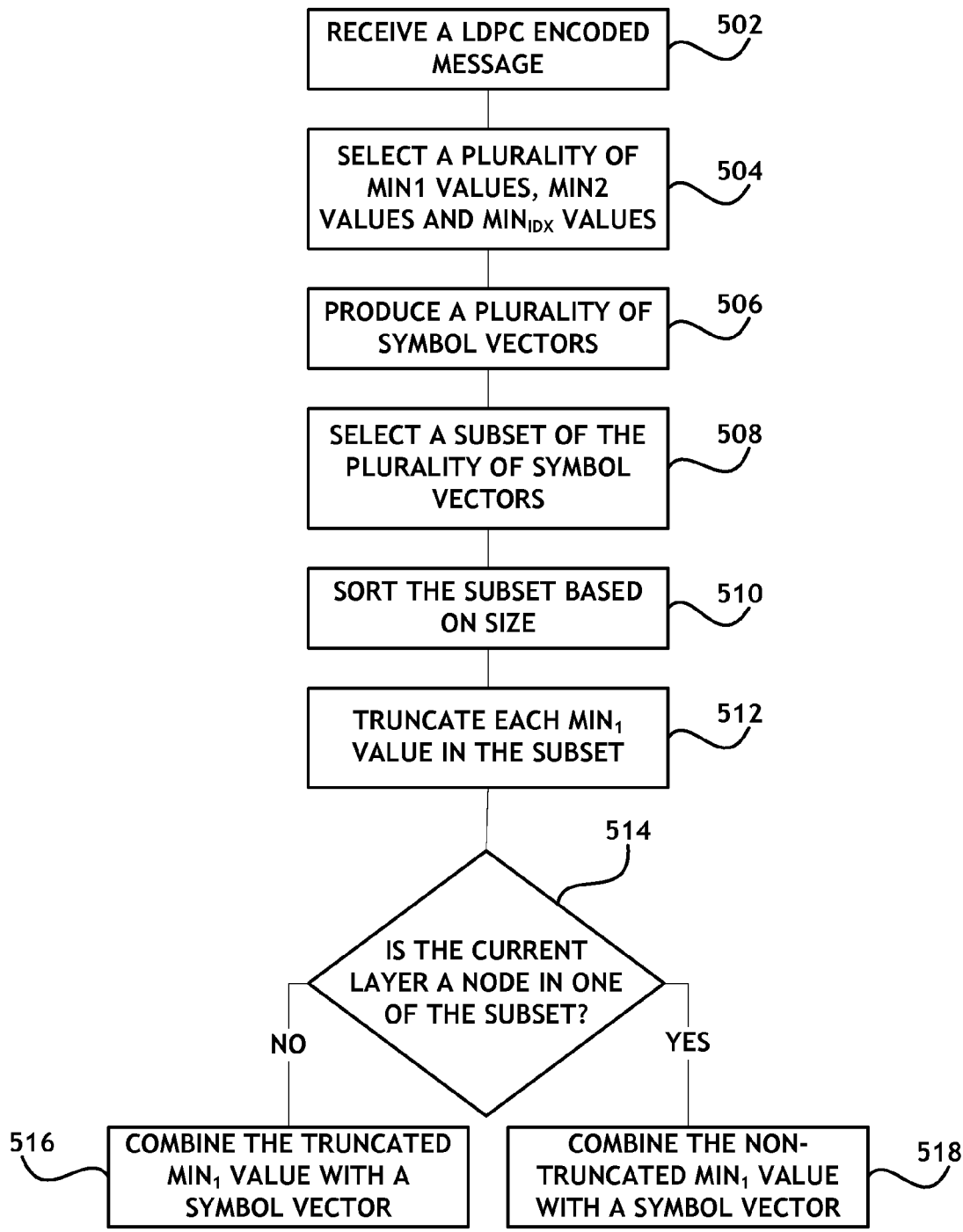
FIG. 5 shows a flowchart for a method of processing messages in a layered LDPC decoder.

Referring to FIG. 5, a flowchart for a method of processing messages in a layered LDPC decoder is shown. A check node unit may receive 502 a LDPC encoded message comprising one or more message entries. Each message entry may include a $MIN_1$ value, a $MIN_2$ value and a $MIN_{idx}$ value. The check node unit may select 504 a value from one of the associated $MIN_1$ value, $MIN_2$ value and $MIN_{idx}$ value for each entry based on a layer value associated with the layer being processed. The check node unit may thereby produce 506 a plurality of symbol vectors.

The check node unit may select 508 a predetermined number of entries from the plurality of symbol vectors and store, in a data structure, corresponding symbol indices and values for each selected entry. The check node unit may also create and store an index associated with each selected entry indicating the location of each entry. The check node unit may sort 510 the entries based on size. The value stored with each symbol index may be a corresponding check-to-variable (C2V) message or variable-to-check (V2C) message.

The check node unit may truncate 512 each $MIN_1$ value for $\log_2(q)$ smallest entries and produce vectors for each of the predetermined number of entries. Each vector may include a $MIN_{vn}$ value corresponding to an index location for a particular variable node, a $MIN_{val}$ value corresponding to the value stored with the symbol index for a particular entry (soft value) and $MIN_{sym}$ value corresponding to a symbol index. The check node unit may then determine 514 if the truncated or non-truncated $MIN_1$ value should be used for processing. Where the current layer is not included in any $MIN_{vn}$ value for any of the predetermined number of entries, the encoded message may be processed by combining 516 the truncated $MIN_1$ value with a symbol vector; otherwise the non-truncated value may be combined 518 with the symbol vector. Combined MIN1 values and symbol vectors may be placed in a state register for use in subsequent iterations of message processing.

Because C2V and V2C messages are truncated, the present invention reduces memory requirements. Furthermore, because MIN and MIN' vectors are truncated, CN processing complexity may be reduced.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of processing low-density parity-check code (LDPC) messages comprising:
   receiving a variable-to-check (V2C) message from a first decoding unit configured to process a first layer;
   checking values from the first decoding unit and a second decoding unit configured to process a second layer;
   storing one or more log-likelihood ratio (LLR) values, Q values and P values with a ping-pong memory (LPQ) unit;
   selecting a $MIN_1$ value, a $MIN_2$ value and a $MIN_{idx}$ for each entry in the V2C message;
   producing a plurality of symbol vectors, each vector including a $MIN_1$ value, a $MIN_2$ value and a $MIN_{idx}$;
   selecting a subset of symbol vectors;
   storing one or more $MIN_1$ values $MIN_2$ values and $MIN_{idx}$ values with a final state register.

2. The method of claim 1, wherein selecting the subset of symbol vectors comprises selecting $\log_2(q)$ symbol vector where q corresponds to the number of entries in the LDPC.

3. The method of claim 2, wherein the subset of symbol vectors is selected based on the relative size of an entry associated with each symbol vector.

4. The method of claim 1, further comprising truncating at least one $MIN_1$ value in the subset of symbol vectors.

5. The method of claim 4, further comprising combining the at least one truncated $MIN_1$ value with a symbol vector.

6. A apparatus for processing low-density parity-check code (LDPC) messages comprising:
   a first decoding unit configured to process a first layer;
   a second decoding unit configured to process a second layer;
   a check node unit configured to check values from the first decoding unit and the second decoding unit;
   a ping-pong memory (LPQ) unit connected to the first decoding unit and the second decoding unit; and
   a final state register connected to the check node unit and the LPQ unit,
   wherein the check node unit is configured to:
   receive a variable-to-check (V2C) message from the first decoding unit;
   select a $MIN_1$ value, a $MIN_2$ value and a $MIN_{idx}$ for each entry in the V2C message;
   produce a plurality of symbol vectors, each vector including a $MIN_1$ value, a $MIN_2$ value and a $MIN_{idx}$; and
   select a subset of symbol vectors, and
   wherein:

the LPQ unit is configured to store one or more log-likelihood ratio (LLR) values, Q values and P values; and the final state register is configured to store one or more $MIN_1$ values, $MIN_2$ values and $MIN_{idx}$ values.

7. The apparatus of claim 6, wherein selecting the subset of symbol vectors comprises selecting $\log_2(q)$ symbol vector where q corresponds to the number of entries in the LDPC.

8. The apparatus of claim 7, wherein the subset of symbol vectors is selected based on the relative size of an entry associated with each symbol vector.

9. The apparatus of claim 6, further comprising truncating at least one $MIN_1$ value in the subset of symbol vectors.

10. The apparatus of claim 9, further comprising combining the at least one truncated $MIN_1$ value with a symbol vector.

11. The apparatus of claim 6, wherein the first decoding unit comprises:
an initial converter connected to the LPQ unit, configured to convert a hard decision and three LLR values into four LLR values;
an adder connected to the initial converter, configured to add a Q value from the initial converter to an R value;
a first comparator and subtractor connected to the adder, configured to find a minimum value and a hard decision based on an output from the adder;
a rearranger connected to the first comparator and subtractor, configured to rearrange one or more variable node updated values;
a delta shifter connected to the rearranger, configured to bit-shift an output from the rearranger;
a secondary converter connected to the delta shifter, configured to convert a hard decision and three LLR values into four LLR values;
an subtractor connected to the secondary converter, configured to subtract an R value from a soft LLR P value to produce a Q value; and
a second comparator and subtractor connected to the subtractor, configured to compare four values from the output of the subtractor to find a minimum value and a hard decision, subtract the minimum value from four soft LLR values, and send an output to the LPQ unit.

12. The apparatus of claim 11, wherein the output from the second comparator and subtractor is sent to the check node unit.

13. A check node unit for processing low-density parity-check code (LDPC) messages, the check node unit connected to a first decoding unit for processing a first layer and a second decoding unit for processing a second layer, the check node unit comprising comprising:
a plurality of selection units, each selection unit configured to receive and select a $MIN_1$ value, a $MIN_2$ value and a $MIN_{idx}$ for each entry in a LDPC message;
a combine unit connected to the plurality of selection units, configured to sort a plurality of symbol vectors according to a size of an associated entry and select a subset of symbol vectors;
a ping-pong memory (LPQ) unit connected to the first decoding unit and the second decoding unit, configured to store one or more log-likelihood ratio (LLR) values, Q values and P values; and
a final state register configured to store one or more $MIN_1$ values, $MIN_2$ values and $MIN_{idx}$ values,
wherein:
the check node unit is configured to receive a variable-to-check (V2C) message from the first decoding unit;
the check node unit is configured to produce a plurality of symbol vectors, each vector including a $MIN_1$ value, a $MIN_2$ value and a $MIN_{idx}$; and
each selection unit is configured to select a subset of symbol vectors.

14. The apparatus of claim 13, wherein selecting the subset of symbol vectors comprises selecting $\log_2(q)$ symbol vector where q corresponds to the number of entries in the LDPC.

15. The apparatus of claim 14, wherein the subset of symbol vectors is selected based on the relative size of an entry associated with each symbol vector.

16. The apparatus of claim 13, further comprising a truncating unit connected to the combine unit, configured to truncate at least one $MIN_1$ value in the subset of symbol vectors.

17. The apparatus of claim 16, wherein the combine unit is further configured to combine the at least one truncated $MIN_1$ value with a symbol vector.

18. The apparatus of claim 16, wherein the combine unit is further configured to determine that the at least one truncated $MIN_1$ value is associated with at least one variable node corresponding to a LDPC layer being processed.

19. The apparatus of claim 18, further configured to exclude the at least one $MIN_1$ value from a symbol vector.

* * * * *